(12) United States Patent
Tohyama

(10) Patent No.: US 9,287,301 B2
(45) Date of Patent: Mar. 15, 2016

(54) SOLID-STATE IMAGE SENSING DEVICE WITH DETECTING UNITS HAVING A MICROLENS

(71) Applicant: Shigeru Tohyama, Tokyo (JP)

(72) Inventor: Shigeru Tohyama, Tokyo (JP)

(73) Assignee: NEC CORPORATION, Tokyo (JP)

( * ) Notice: Subject to any disclaimer, the term of this patent is extended or adjusted under 35 U.S.C. 154(b) by 274 days.

(21) Appl. No.: 13/793,607

(22) Filed: Mar. 11, 2013

(65) Prior Publication Data

US 2013/0248686 A1 Sep. 26, 2013

(30) Foreign Application Priority Data

Mar. 26, 2012 (JP) ................ 2012-068674

(51) Int. Cl.

| | |
|---|---|
| H01L 27/146 | (2006.01) |
| G01J 5/20 | (2006.01) |
| G01J 1/04 | (2006.01) |
| G01J 1/44 | (2006.01) |
| G01J 5/02 | (2006.01) |
| G01J 5/22 | (2006.01) |
| G01J 1/42 | (2006.01) |
| G01J 5/08 | (2006.01) |
| G01J 5/00 | (2006.01) |

(52) U.S. Cl.
CPC .............. H01L 27/146 (2013.01); G01J 1/0411 (2013.01); G01J 1/4228 (2013.01); G01J 1/44 (2013.01); G01J 5/024 (2013.01); G01J 5/0225 (2013.01); G01J 5/0846 (2013.01); G01J 5/20 (2013.01); G01J 5/22 (2013.01); H01L 27/14645 (2013.01); H01L 27/14649 (2013.01); H01L 27/14689 (2013.01); G01J 2005/0077 (2013.01); G01J 2005/202 (2013.01); *H01L 27/14609* (2013.01); *H01L 27/14627* (2013.01); *H01L 27/14683* (2013.01)

(58) Field of Classification Search
CPC ............ H01L 27/146; H01L 27/14627; H01L 27/14689
USPC ................................ 250/208.1; 257/290–292
See application file for complete search history.

(56) References Cited

U.S. PATENT DOCUMENTS 5,373,182 A * 12/1994 Norton .......................... 257/440
6,107,618 A * 8/2000 Fossum et al. ............. 250/208.1

(Continued)

FOREIGN PATENT DOCUMENTS

| JP | 11-214668 A | 8/1999 |
|---|---|---|
| JP | 2006-165663 A | 6/2006 |

(Continued)

OTHER PUBLICATIONS

Communication dated Nov. 18, 2015 from the Japanese Patent Office in counterpart application No. 2012-068674.

*Primary Examiner* — Seung C Sohn
(74) *Attorney, Agent, or Firm* — Sughrue Mion, PLLC

(57) ABSTRACT

A solid-state image sensing device has a plurality of detection units periodically arranged as a two-dimensional array on a substrate. Each of the detection units includes a visible light detector and an infrared light detector arranged on the same optical axis in a vertical direction so that the visible light detector and the infrared light detector overlap with each other. Each of the detection units also includes a signal readout circuit provided in the substrate so as to output signals of the visible light detector and the infrared light detector as time-series signals.

7 Claims, 8 Drawing Sheets

(56) References Cited

U.S. PATENT DOCUMENTS

| | | | |
|---|---|---|---|
| 6,379,979 B1 * | 4/2002 | Connolly | 438/7 |
| 7,294,524 B2 | 11/2007 | Park | |
| 8,865,507 B2 * | 10/2014 | Haddad et al. | 438/67 |
| 2006/0119724 A1 | 6/2006 | Inuiya | |
| 2007/0037314 A1 | 2/2007 | Park | |

FOREIGN PATENT DOCUMENTS

| | | |
|---|---|---|
| JP | 2006-343229 A | 12/2006 |
| JP | 2007-73966 A | 3/2007 |
| JP | 2008-204978 A | 9/2008 |
| JP | 2011-238877 A | 11/2011 |

* cited by examiner

SOLID-STATE IMAGE SENSING DEVICE WITH DETECTING UNITS HAVING A MICROLENS

This application is based upon and claims the benefit of priority from Japanese patent application No. 2012-068674, filed on Mar. 26, 2012, the disclosure of which is incorporated herein in its entirety by reference.

FIELD OF THE INVENTION

The present invention relates to a solid-state image sensing device and a method of manufacturing the same. More particularly, the present invention relates to a solid-state image sensing device with quantum visible light detectors and thermal infrared light detectors for concurrently conducting visible light imaging and infrared light imaging, and a method of manufacturing such a solid-state image sensing device.

BACKGROUND ART

In an optical imaging system for human detection used in security application or the like, visible light imaging and infrared light imaging are combined with each other so that the detection capability can be improved. This type of conventional imaging systems employs a simple combination of two imaging systems including a visible light imaging system and an infrared light imaging system. However, such conventional imaging systems are large in size. Additionally, complicated processes need to be performed on two optical images for data analysis. Therefore, there has been desired an imaging system capable of conducting both of visible light imaging and infrared light imaging with one camera.

In this regard, there has been proposed an image sensor that achieves visible light imaging and infrared light imaging with one chip. With this technology, images with two wavelength ranges of visible light and infrared light can be taken with one chip.

For example, the related technology is disclosed in JP-A 2006-343229 (Patent Literature 1) and JP-A 2008-204978 (Patent Literature 2).

With the technology disclosed in Patent Literatures 1 and 2, pixels for detecting visible light and pixels for detecting infrared light are independent of each other. Therefore, the resolution of an image for each of the wavelength ranges is lowered in directions in which those different types of pixels are alternately arranged. For example, when columns of pixels for detecting visible light and columns of pixels for detecting infrared light are alternately arranged, the resolution of an image becomes half in the horizontal direction. When rows of pixels for detecting visible light and rows of pixels for detecting infrared light are alternately arranged, the resolution of an image becomes half in the vertical direction. When pixels for detecting visible light and pixels for detecting infrared light are alternately arranged in the column direction and the row direction, the resolution of an image becomes $1/\sqrt{2}$ in each of the horizontal and vertical directions.

Additionally, with the technology disclosed in Patent Literatures 1 and 2, points at which visible light is detected are not exactly identical to points at which infrared light is detected. Therefore, the data precision is excessively low in a field in which precise measurement is required.

SUMMARY OF THE INVENTION

The present invention has been made to provide technology for solving the aforementioned problems in the prior art.

It is, therefore, an object of the present invention to provide a solid-state image sensing device capable of enhancing data precision between points at which visible light is detected and points at which infrared light is detected without lowering a resolution of an image in a horizontal direction or a vertical direction, and a method of manufacturing such a solid-state image sensing device.

According to one aspect of the present invention, there is provided a solid-state image sensing device having a plurality of detection units periodically arranged as a two-dimensional array on a substrate. Each of the plurality of detection units includes a visible light detector and an infrared light detector arranged on the same optical axis in a vertical direction so that the visible light detector and the infrared light detector overlap with each other. Each of the plurality of detection units also includes a signal readout circuit provided in the substrate so as to output signals of the visible light detector and the infrared light detector as time-series signals.

According to another aspect of the present invention, there is provided a method of manufacturing a solid-state image sensing device having a visible light detector, an infrared light detector, and a signal readout circuit provided in a substrate for outputting signals of the visible light detector and the infrared light detector as time-series signals. The method includes forming a source/drain region of a transistor and forming a visible light detection layer immediately before or immediately after the forming of the source/drain region upon forming the signal readout circuit in the substrate. The method also includes forming a polyimide layer on the substrate, forming a photoresist pattern on the polyimide layer at a location right above the visible light detection layer, and performing a heat treatment for reflowing on the photoresist pattern so as to form the photoresist pattern into a lens shape. The method also includes performing etching-back to transfer the lens shape of the photoresist pattern to the polyimide layer to thereby form a microlens of polyimide. The method includes forming a microlens protective film for protecting the microlens and forming the infrared light detector by using a sacrifice layer so that the visible light detector and the infrared light detector are arranged on the same optical axis in a vertical direction so as to overlap with each other.

DETAILED DESCRIPTION OF THE PREFERRED EMBODIMENTS

Related Art

Figure 8:
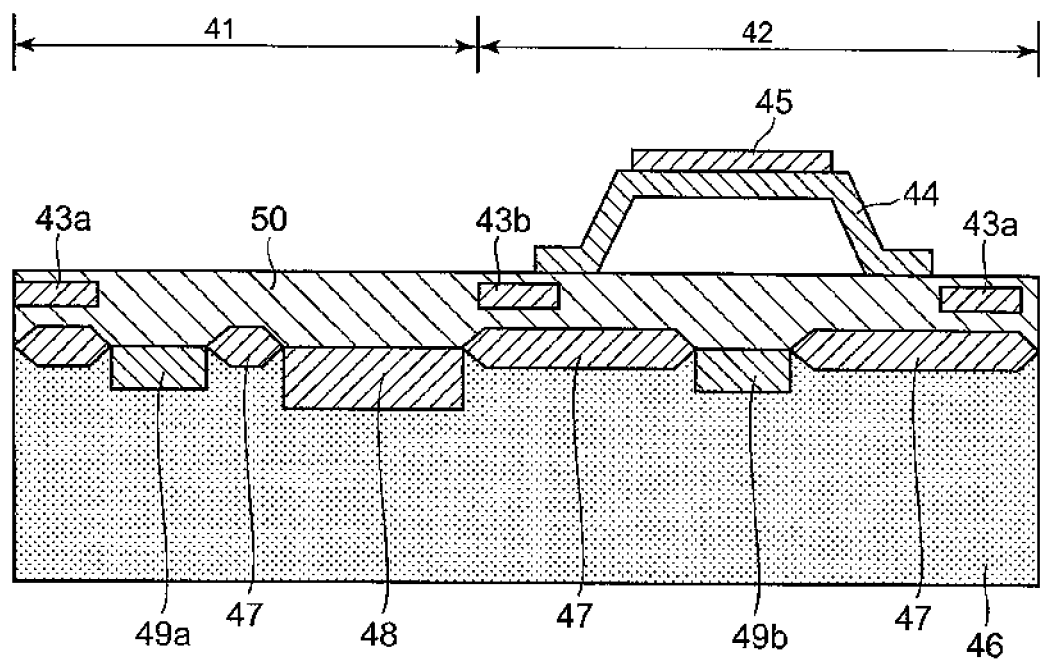
FIG. 8 is a cross-sectional view showing a structure of a solid-state image sensing device in related art disclosed in Patent Literature 1.

First, in order to clarify the features of the present invention, a structure of a solid-state image sensing device as disclosed in Patent Literature 1 will briefly be described as related art with reference to FIG. 8. FIG. 8 is a cross-sectional view showing part of an imaging area.

Referring to FIG. 8, a pixel 41 for detecting visible light and a pixel 42 for detecting infrared light are positioned adjacent to each other. The pixel 41 for detecting visible light includes a photodiode 48 formed in a Si substrate 46 and a readout circuit 49a including a MOS transistor formed in the Si substrate 46 for row selection. The pixel 42 for detecting infrared light includes a thermal insulation structure 44 formed on a dielectric film 50, which has been formed on the Si substrate 46, a bolometer 45 formed on the thermal insulation structure 44, and a readout circuit 49b including a MOS transistor formed in the Si substrate 46 for row selection. A field oxide film 47 is formed on the Si substrate 46 for electrically isolating optical detectors from each other. Furthermore, the dielectric film 50 deposited on the photodiode 48 is formed of a material that is transparent to visible light.

In the imaging area, columns of pixels 41 for detecting visible light and columns of pixels 42 for detecting infrared light may alternately be arranged, or rows of pixels 41 for detecting visible light and rows of pixels 42 for detecting infrared light may alternately be arranged. Alternatively, pixels 41 for detecting visible light and pixels 42 for detecting infrared light may alternately be arranged in the column direction and the row direction. With this arrangement, visible light imaging and infrared light imaging can be conducted independently and concurrently by one chip.

Each of the infrared light detectors in the solid-state image sensing device is formed of a thermal detector having a thermal insulation structure 44. Therefore, a cooler for cooling the detectors down to a very low temperature or the like can be dispensed with. Accordingly, it is advantageous in that the size of an imaging system and the cost for manufacturing an imaging system can be reduced.

With the related art, however, since pixels 41 for detecting visible light and pixels 42 for detecting infrared light are independent of each other, the resolution of an image of each of the wavelength ranges is problematically lowered in directions in which those different types of pixels are alternately arranged. For example, when columns of pixels 41 for detecting visible light and columns of pixels 42 for detecting infrared light are alternately arranged, the resolution of an image becomes half in the horizontal direction. When rows of pixels 41 for detecting visible light and rows of pixels 42 for detecting infrared light are alternately arranged, the resolution of an image becomes half in the vertical direction. When pixels 41 for detecting visible light and pixels 42 for detecting infrared light are alternately arranged in the column direction and the row direction, the resolution of an image becomes $1/\sqrt{2}$ in each of the horizontal and vertical directions.

Additionally, points at which visible light is detected are not exactly identical to points at which infrared light is detected. Therefore, the data precision is excessively low in a field in which precise measurement is required.

Embodiments of the Present Invention

Embodiments of the present invention are for solving the aforementioned problems of the related art. The embodiments provide a solid-state image sensing device having quantum visible light detectors and thermal infrared light detectors for concurrently conducting visible light imaging and infrared light imaging. The solid-state image sensing device can enhance data precision between points at which visible light is detected and points at which infrared light is detected without lowering a resolution of an image in a horizontal direction or a vertical direction.

In an embodiment of the present invention, a solid-state image sensing device has a plurality of detection units periodically arranged as a two-dimensional array on a substrate. Each of the detection units includes a quantum visible light detector, a thermal infrared light detector, and a signal readout circuit provided in the substrate for outputting signals of the quantum visible light detector and the thermal infrared light detector as time-series signals. The quantum visible light detector and the thermal infrared light detector are arranged on the same optical axis (shown in FIG. 1.)

It is preferable to provide a microlens between the visible light detector and the infrared light detector. The microlens is preferably covered with a microlens protective film. Furthermore, the microlens is preferably made of polyimide.

Furthermore, in an embodiment of the present invention, there is provided a method of manufacturing a solid-state image sensing device for both of visible light and infrared light. The solid-state image sensing device has a plurality of detection units periodically arranged as a two-dimensional array on a substrate. Each of the detection units includes a quantum visible light detector, a thermal infrared light detector, and a signal readout circuit provided in the substrate for outputting signals of the quantum visible light detector and the thermal infrared light detector as time-series signals. When the signal readout circuit is formed in the substrate by a usual Si-LSI production method, a visible light detection layer is formed immediately before or immediately after a step of forming a source/drain region of a transistor. A polyimide layer is formed on the substrate having the signal readout circuit. A photoresist pattern is formed on the polyimide layer at a location right above the visible light detection layer.

A heat treatment for reflowing is performed on the photoresist pattern so that the photoresist pattern is formed into a lens shape. An etching-back process is performed so that the lens shape of the photoresist pattern is transferred to the polyimide layer. Thus, a microlens of polyimide is formed. A microlens protective film for protecting the microlens of polyimide is formed. The thermal infrared light detector is formed by a usual MEMS production method using a sacrifice layer.

With a solid-state image sensing device according to an embodiment of the present invention, the quantum visible light detector and the thermal infrared light detector are arranged on the same optical axis. Therefore, the resolution of an image can be held at a high value in both of a horizontal direction and a vertical direction.

Furthermore, since the microlens is provided between the quantum visible light detector and the thermal infrared light detector, an effective aperture ratio can be held at a high value even if an area of the visible light detection layer is limited by components of the signal readout circuit.

Moreover, the microlens is covered with the microlens protective film. Therefore, polyimide, which is often used for a sacrifice layer in a production process of thermal infrared light detectors, can be used as a material for the microlens.

In a method of manufacturing a solid-state image sensing device according to the present invention, when the signal readout circuit is formed in the substrate by a usual Si-LSI production method, a visible light detection layer is formed immediately before or immediately after a step of forming a source/drain region of a transistor. A polyimide layer is formed on the substrate having the signal readout circuit. A photoresist pattern is formed on the polyimide layer at a location right above the visible light detection layer. A heat treatment for reflowing is performed on the photoresist pattern so that the photoresist pattern is formed into a lens shape. An etching-back process is performed so that the lens shape of the photoresist pattern is transferred to the polyimide layer. Thus, a microlens of polyimide is formed. A microlens protective film for protecting the microlens of polyimide is formed. The thermal infrared light detector is formed by a usual MEMS production method using a sacrifice layer. Accordingly, a solid-state image sensing device having the aforementioned structure according to the present invention can be obtained.

Embodiments of the present invention will be described below in detail with reference to FIGS. 1 to 7B.

Figure 1:
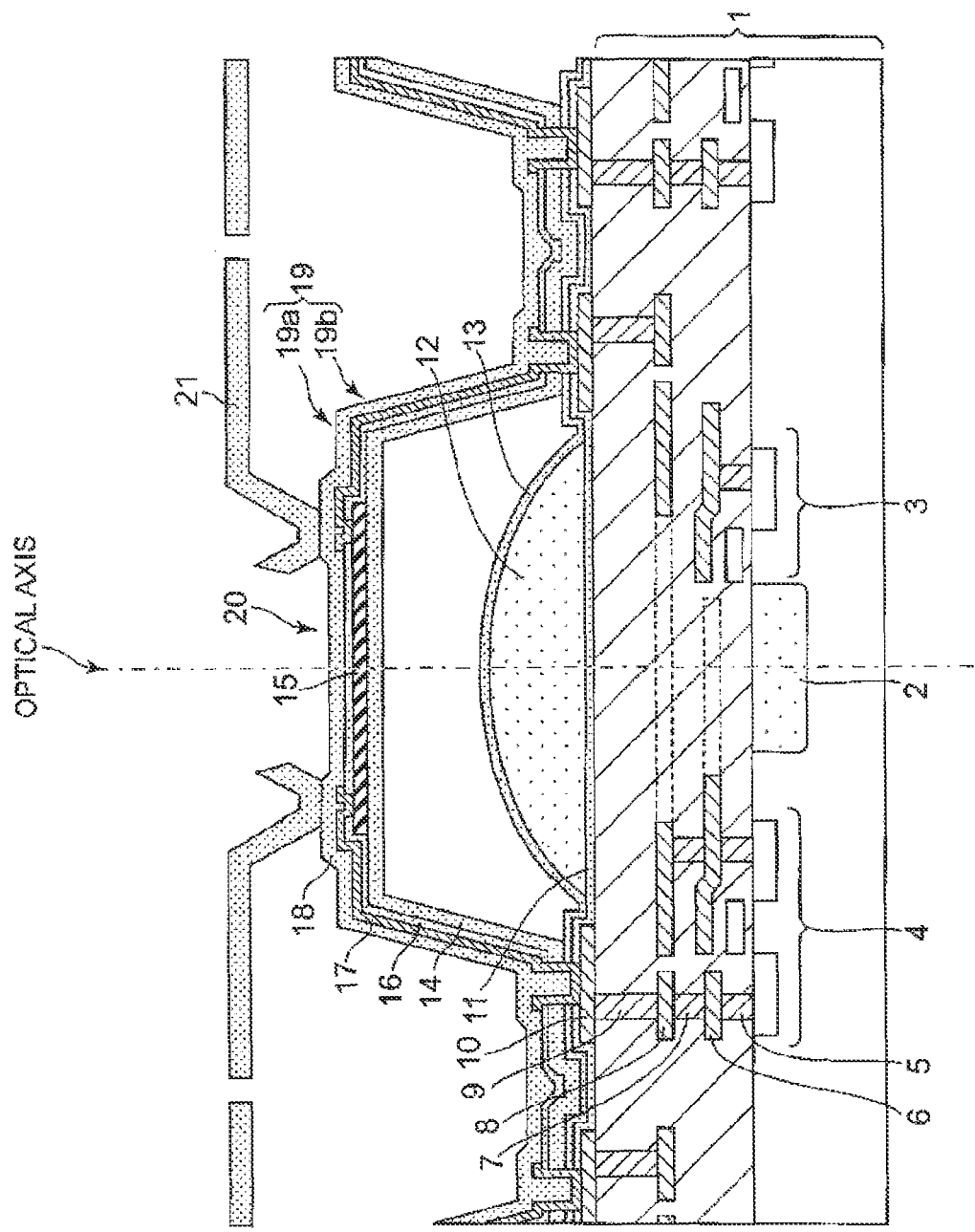
FIG. 1 is a cross-sectional view showing a structure of a unit pixel in a solid-state image sensing device according to an embodiment of the present invention.
Figure 2:
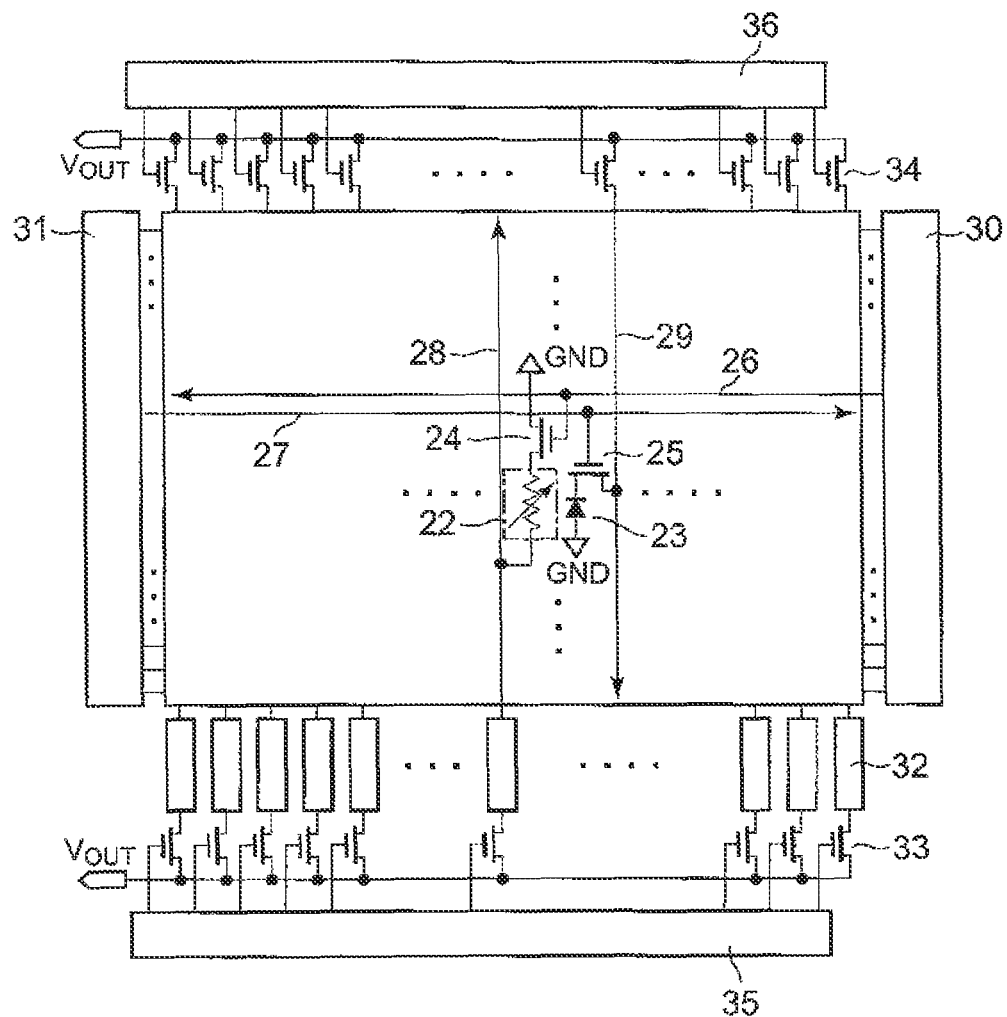
FIG. 2 is a diagram showing the entire configuration of the solid-state image sensing device according to the embodiment of the present invention.

FIG. 1 is a cross-sectional view showing a structure of a unit pixel in a solid-state image sensing device according to an embodiment of the present invention. FIG. 2 is a diagram showing the entire configuration of the solid-state image sensing device according to the embodiment of the present invention. Although FIG. 2 only illustrates a circuit for one pixel, a plurality of unit pixels as shown in FIG. 1 are arrayed in the solid-state image sensing device shown in FIG. 2.

The solid-state image sensing device has a plurality of unit pixels (detection units) periodically arranged as a two-dimensional array on a Si substrate. As shown in FIG. 1, each of the unit pixels includes a visible light detection layer 2, a vertical MOS switch transistor 3 for visible light, and vertical MOS switch transistors 4 for infrared light, which are formed in a Si substrate 1 having a signal readout circuit. The vertical MOS switch transistor 3 for visible light is connected to a first Al wiring layer 6, which corresponds to a vertical signal line 29 for visible light in FIG. 2, through a via-connection electrode 5. One of the vertical MOS switch transistors 4 for infrared light is connected to a connection electrode 10 through the via-connection electrode 5, the first Al wiring layer 6, a via-connection electrode 7, a second Al wiring layer 8, and a via-connection electrode 9. The other vertical MOS switch transistors 4 for infrared light is connected to a GND line of the first Al wiring layer 6 and the second Al wiring layer 8 through the via-connection electrode 5 and the via-connection electrode 7. Portions of the first Al wiring layer 6 and the second Al wiring layer 8 of the GND line that are indicated by dashed lines are not present on the illustrated cross-section and serve as light shield films for shielding areas other than the visible light detection layer 2. In other words, those dashed portions of the first Al wiring layer 6 and the second Al wiring layer 8 correspond to an opening (window) for the visible light detection layer 2. Alternatively, a separate light shield film may be provided instead.

Another connection electrode 10 is not connected to the vertical MOS switch transistors 4 for infrared light, but is connected to the second Al wiring layer 8, which corresponds to a vertical signal line 28 for infrared light in FIG. 2, through a via-connection electrode 9.

The visible light detection layer 2 is generally connected to a vertical or horizontal overflow drain, which is not particularly illustrated, for providing a blooming prevention function or an electronic shutter function.

A thermal infrared light detector includes two support legs 19 and a diaphragm 20 lifted up from the Si substrate 1 and held in midair by those support legs 19. The support legs 19 include a horizontal portion 19a and rising portions 19b. This structure allows the diaphragm 20 to be thermally isolated from the Si substrate 1.

The diaphragm 20 includes therein a bolometer film 15 as a mechanism for detecting temperature changes. The bolometer film 15 is covered with a lower support film 14 and a bolometer protective film 16. For example, the bolometer film 15 may have a film thickness in a range of 30 nm to 200 nm. The bolometer film 15 may be made of vanadium oxide ($V_2O_3$ or $VO_x$) or titanium oxide ($TiO_x$). Ends of the bolometer film 15 are connected to electrode wires 17 via contact holes formed in the bolometer protective film 16. The electrode wires 17 are covered with an upper support film 18. For example, each of the layer support film 14, the bolometer protective film 16, and the upper support film 18 may be formed of a silicon oxide film (SiO or $SiO_2$), a silicon nitride film (SiN or $Si_3N_4$), or a silicon oxynitride film (SiON) having a film thickness in a range of 20 nm to 800 nm.

Each of the electrode wires 17 may have a film thickness in a range of 10 nm to 200 nm. The electrode wires 17 may be made of aluminum (Al), copper (Cu), gold (Au), titanium (Ti), tungsten (W), molybdenum (Mo), an alloy of titanium, aluminum, and vanadium (TiAlV alloy), or a semiconductor in which Si or the like has been doped with impurities at a high concentration. The two electrode wires 17 extend within the separate support legs 19 so that they are connected to the connection electrodes 10 via contact holes formed above the connection electrodes 10. The diaphragm 20 has visors 21 for increasing a light-receiving area to improve the infrared sensitivity. For example, each of the visors 21 may be formed of a silicon oxide film (SiO or $SiO_2$), a silicon nitride film (SiN or $Si_3N_4$), or a silicon oxynitride film (SiON) having a film thickness in a range of 100 nm to 1,000 nm.

A microlens 12 is provided within a cavity formed below the diaphragm 20. The microlens 12 is positioned right above the visible light detection layer 2. The microlens 12 is made of a high polymeric organic material. If the microlens 12 is made of polyimide, which has frequently been used as a sacrifice layer during a production process of a thermal infrared light detector, then the microlens 12 can have the best matching property. The microlens 12 is covered with a microlens protective film 13 so that the microlens 12 is protected from damages caused during a production process of the thermal infrared light detector. For example, the microlens protective film 13 may be formed of a silicon oxide film (SiO or $SiO_2$), a silicon nitride film (SiN or $Si_3N_4$), or a silicon oxynitride film (SiON) having a film thickness in a range of 20 nm to 1,000 nm.

An infrared ray incident on the unit pixel is absorbed and converted into heat by the diaphragm 20 including the visors 21, so that the temperature of the diaphragm 20 is increased. The temperature increase of the diaphragm 20 changes a resistance of the bolometer film 15 formed within the diaphragm 20. Thus, infrared light can be detected by electrically reading the resistance change of the bolometer film 15.

Meanwhile, a visible ray incident on the unit pixel is transmitted through the diaphragm 20 including the visors 21, condensed by the microlens 12, and directed to the visible light detection layer 2. The visible ray is absorbed in the visible light detection layer 2 to generate photoexcited carriers. Thus, visible light can be detected by electrically reading those photoexcited carriers. In this manner, both of visible light and infrared light can be detected effectively with the same unit pixel.

As shown in FIG. 2, the unit pixel includes a bolometer type infrared detector 22, a visible light detector (photodiode) 23, a vertical MOS switch 24 for infrared light, and a vertical MOS switch 25 for visible light. The bolometer type infrared detector 22 has a first end connected to the vertical MOS switch 24 for infrared light and a second end connected a vertical signal line 28 for infrared light. The vertical MOS switch 24 for infrared light has a gate connected to a drive line 26 for infrared light. The drive line 26 for infrared light is connected to a vertical scanning circuit 30 for infrared light. The vertical signal line 28 for infrared light is connected to an integration circuit 32, which is connected to a first end of a horizontal MOS switch 33 for infrared light. The horizontal MOS switch 33 for infrared light has a second end connected to an output terminal. The horizontal MOS switch 33 for infrared light has a gate connected to a horizontal scanning circuit 35 for infrared light.

Meanwhile, the visible light detector 23 has a first end connected to the vertical MOS switch 25 for visible light and a second end connected to a vertical signal line 29 for visible light. The vertical MOS switch 25 for visible light has a gate connected to a drive line 27 for visible light. The drive line 27 for visible light is connected to a vertical scanning circuit 31 for visible light. The vertical signal line 29 for visible light is connected to a first end of a horizontal MOS switch 34 for visible light. The horizontal MOS switch 34 for visible light has a second end connected to an output terminal. The horizontal MOS switch 34 for visible light has a gate connected to a horizontal scanning circuit 36 for visible light.

As described above, incidence of an infrared ray causes resistance changes of the bolometer type infrared detectors 22 that correspond to the amount of incident infrared light. When the vertical scanning circuit 30 for infrared light scans and selects the drive line 26 for infrared light in the Nth row, then the vertical MOS switches 24 for infrared light that are connected to that drive line 26 and provided in the pixels of the Nth row are turned on. Thus, each of the bolometer type infrared detectors 22 in the Nth row is electrically connected to the corresponding integration circuit 32, where current storage and potential conversion are performed according to the resistance changes of the bolometer type infrared detector 22. Then the horizontal MOS switches 33 for infrared light are sequentially turned on by the horizontal scanning circuit 35 for infrared light. Thus, time-series electric signals corresponding to the resistance changes of the bolometer type infrared detectors 22 in the Nth row are outputted. The same operation is performed for each of the other rows, so that two-dimensional infrared image signals can be obtained.

As described above, incidence of a visible ray causes the visible light detectors (photodiodes) 23 to generate photoexcited carriers, which are stored by PN junction capacitances to cause potential changes. When the vertical scanning circuit 31 for visible light scans and selects the drive line 26 for visible light in the Nth row, then the vertical MOS switches 25 for visible light that are connected to that drive line 26 and provided in the pixels of the Nth row are turned on. Thus, each of the visible light detectors 23 in the Nth row is electrically connected to the corresponding vertical signal line 29 for visible light. Then the horizontal MOS switches 34 for visible light are sequentially turned on by the horizontal scanning circuit 36 for visible light. Thus, time-series electric signals corresponding to the potential changes of the visible light detectors 23 in the Nth row are outputted. The same operation is performed for each of the other rows, so that two-dimensional visible image signals can be obtained.

The ON-potential of each of the vertical MOS switches 25 for visible light determines a reset potential of the visible light detector 23. If the conditions that the vertical MOS switches 24 for infrared light can be operated with the same gate potential, the drive lines in each of the rows may be incorporated into one line, and the vertical scanning circuits may be incorporated into one circuit.

With the above arrangement, a solid-state image sensing device having quantum visible light detectors 23 and thermal infrared light detectors 22 for concurrently conducting visible imaging and infrared imaging can achieve high data precision at each of detection points without lowering the resolution of an image in the horizontal or vertical direction.

Next, a method of manufacturing a solid-state image sensing device according to an embodiment of the present invention will be described in detail with reference to FIGS. 3A to 7B. FIGS. 3A to 7B are cross-sectional views showing primary steps of producing a solid-state image sensing device according to an embodiment of the present invention.

Figure 3A:
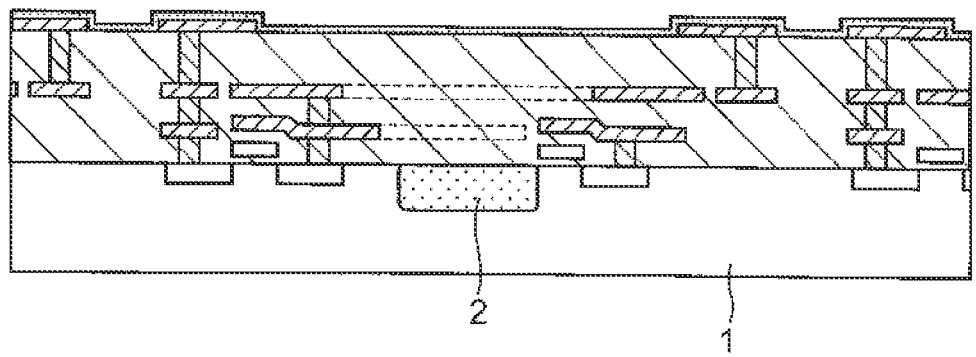
FIG. 3A is a cross-sectional view showing a production step of a method of manufacturing a solid-state image sensing device according to an embodiment of the present invention.

First, as shown in FIG. 3A, when a signal readout circuit is formed in a Si substrate 1 by a usual Si-LSI production method, a visible light detection layer 2 is formed immediately before or immediately after a step of forming a source/drain region of a transistor. Since the source/drain region requires a shallow junction, an ion implantation method with energy of about 10 keV to 100 keV is used for the source/drain region. Since the visible light detection layer 2 needs a relatively deep junction to increase the sensitivity to red, an ion implantation method with energy of about 150 keV to 300 keV is used for the visible light detection layer 2. Subsequently, a step of forming multilayer Al wiring is performed. Thus, a Si substrate 1 having a signal readout circuit with the visible light detection layer 2 formed therein is obtained.

Figure 3B:
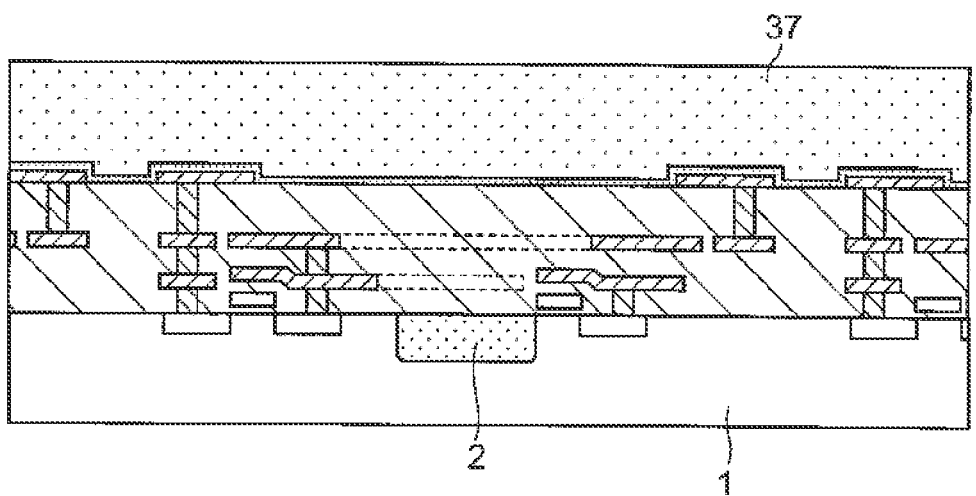
FIG. 3B is a cross-sectional view showing a production step of the method of manufacturing a solid-state image sensing device according to the embodiment of the present invention.

Then, as shown in FIG. 3B, a first polyimide layer 37 is formed on the Si substrate 1. The first polyimide layer 37 is hardened by heat treatment, for example, at about 300° C. to about 500° C. The thickness of the first polyimide layer 37 is set to be slightly larger than the thickest portion of a microlens to be formed. For example, the first polyimide layer 37 may have a thickness of about 1 μm to about 10 μm.

Figure 4A:
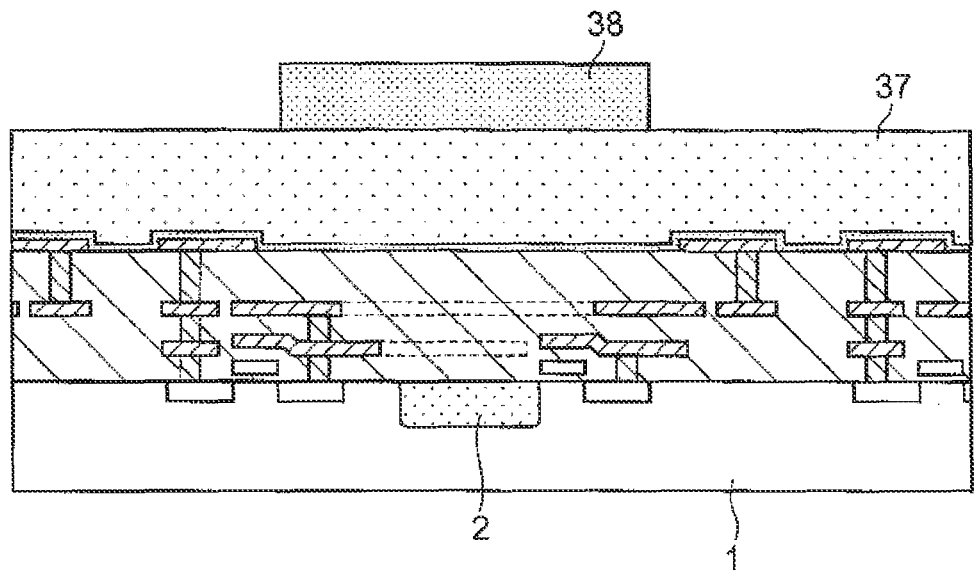
FIG. 4A is a cross-sectional view showing a production step of the method of manufacturing a solid-state image sensing device according to the embodiment of the present invention.

Next, as shown in FIG. 4A, a photoresist pattern 38 is formed on the first polyimide layer 37 at a location right above the visible light detection layer 2. The film thickness of the photoresist pattern 38 is set to be smaller than the film thickness of the first polyimide layer 37 by 20% to 40% because the thickest portion of the photoresist pattern 38 increases in thickness by 20% to 40% when the photoresist pattern 38 is formed into a lens shape.

Figure 4B:
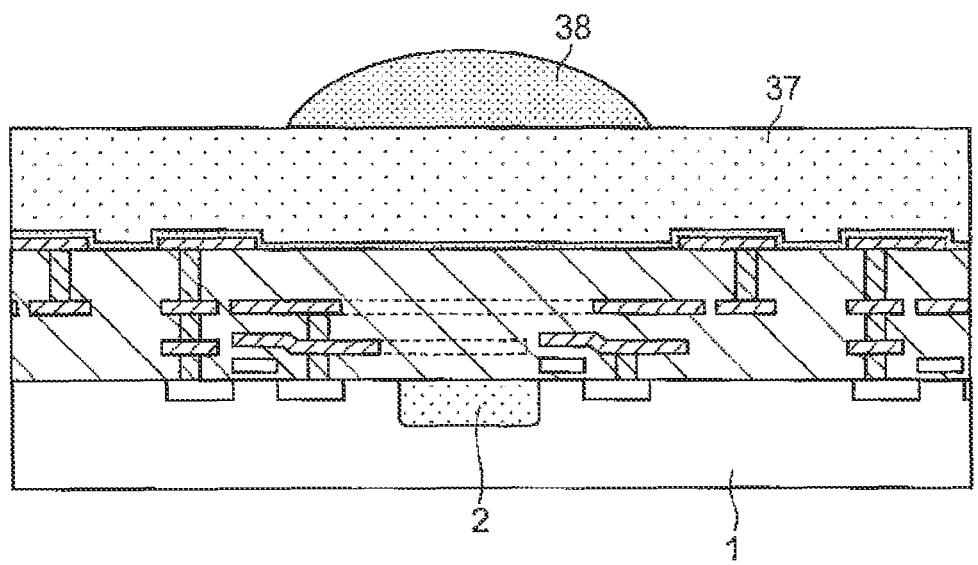
FIG. 4B is a cross-sectional view showing a production step of the method of manufacturing a solid-state image sensing device according to the embodiment of the present invention.

Thereafter, as shown in FIG. 4B, the photoresist pattern 38 is subjected to a heat treatment for reflowing and formed into a lens shape. The temperature of heat treatment depends upon characteristics of the photoresist and is set to be, for example, about 150° C. to about 200° C.

Figure 5A:
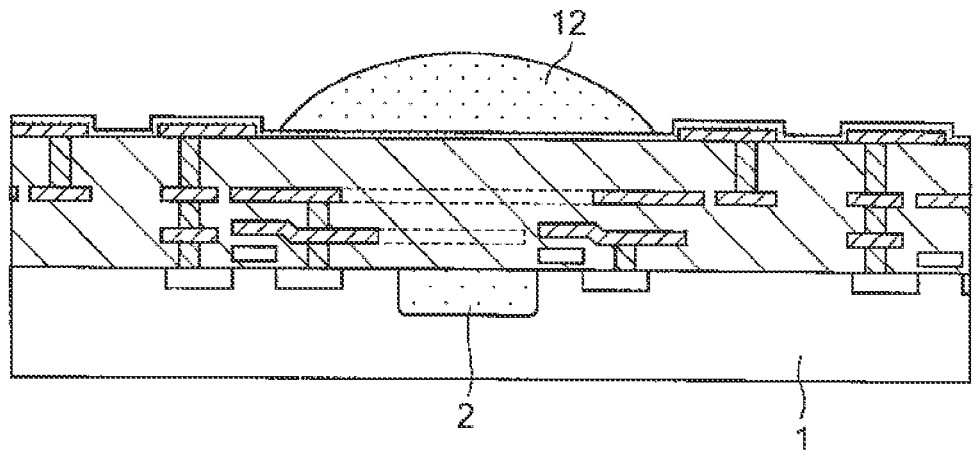
FIG. 5A is a cross-sectional view showing a production step of the method of manufacturing a solid-state image sensing device according to the embodiment of the present invention.

Subsequently, as shown in FIG. 5A, an etching-back process is performed by anisotropic etching with use of $O_2$ or $CF_4$. Thus, the lens shape of the photoresist pattern 38 is transferred to the first polyimide layer 37, so that a microlens 12 is formed.

Figure 5B:
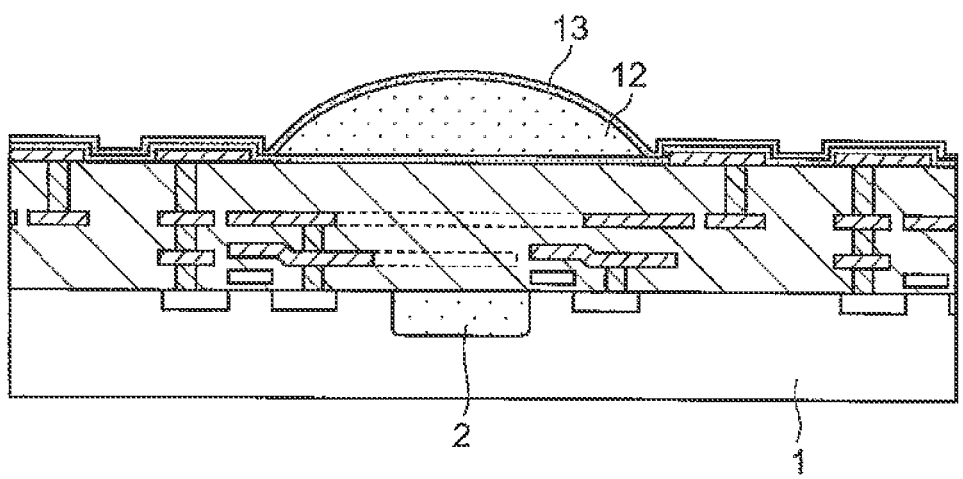
FIG. 5B is a cross-sectional view showing a production step of the method of manufacturing a solid-state image sensing device according to the embodiment of the present invention.

Thereafter, as shown in FIG. 5B, a microlens protective film 13 is formed on the microlens 12.

Subsequent steps are to form a thermal infrared light detector 22 by a usual MEMS production method using a sacrifice layer.

Figure 6A:
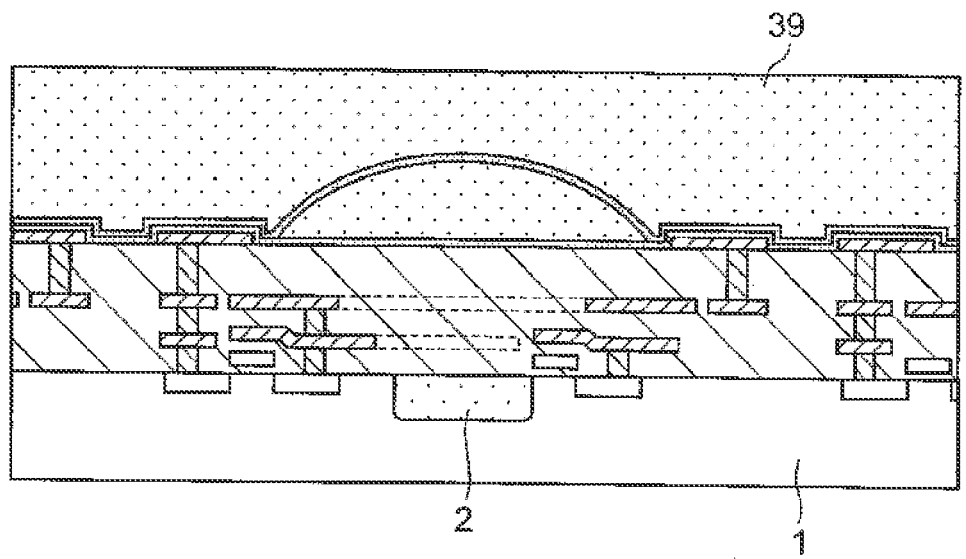
FIG. 6A is a cross-sectional view showing a production step of the method of manufacturing a solid-state image sensing device according to the embodiment of the present invention.

As shown in FIG. 6A, a second polyimide layer 39 is formed as a first sacrifice layer.

Figure 6B:
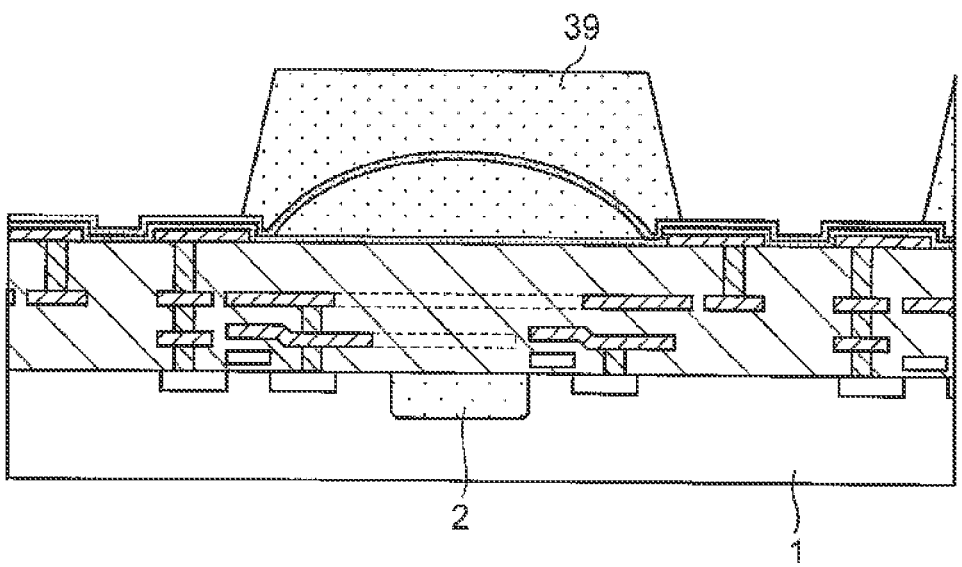
FIG. 6B is a cross-sectional view showing a production step of the method of manufacturing a solid-state image sensing device according to the embodiment of the present invention.

Then, as shown in FIG. 6B, the second polyimide layer 39 is patterned by exposure and development or dry etching so that the second polyimide layer 39 remains at a region at which a cavity is to be formed below a diaphragm 20.

Figure 7A:
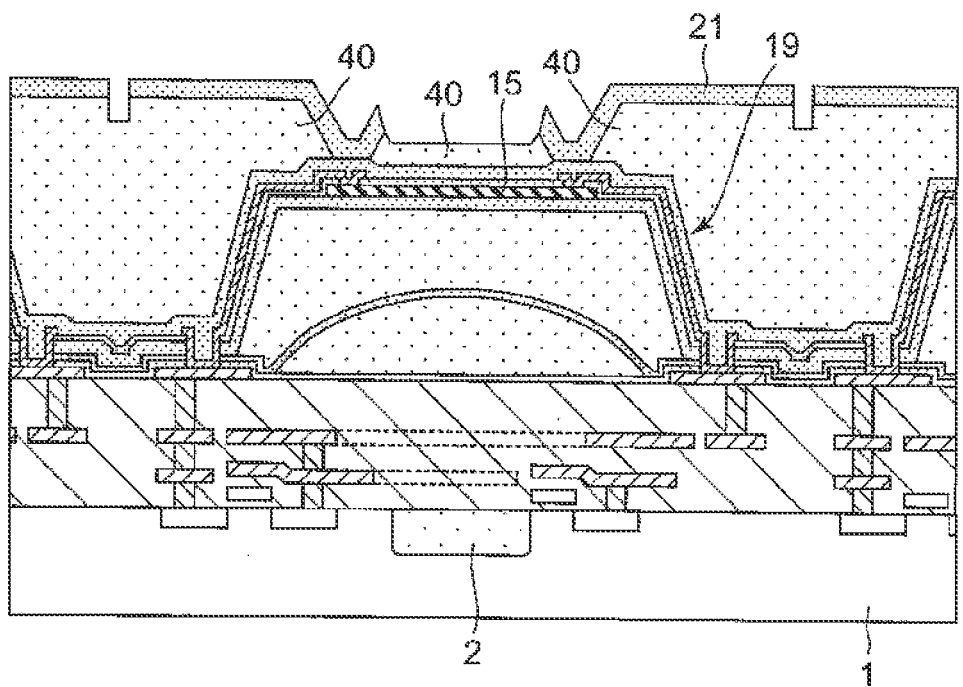
FIG. 7A is a cross-sectional view showing a production step of the method of manufacturing a solid-state image sensing device according to the embodiment of the present invention.

Thereafter, as shown in FIG. 7A, support legs 19, a bolometer film 15, and the like are formed on the first sacrifice layer. Subsequently, a third polyimide layer (second sacrifice layer) 40 is formed thereon, and visors 21 are formed on the uppermost layer.

Figure 7B:
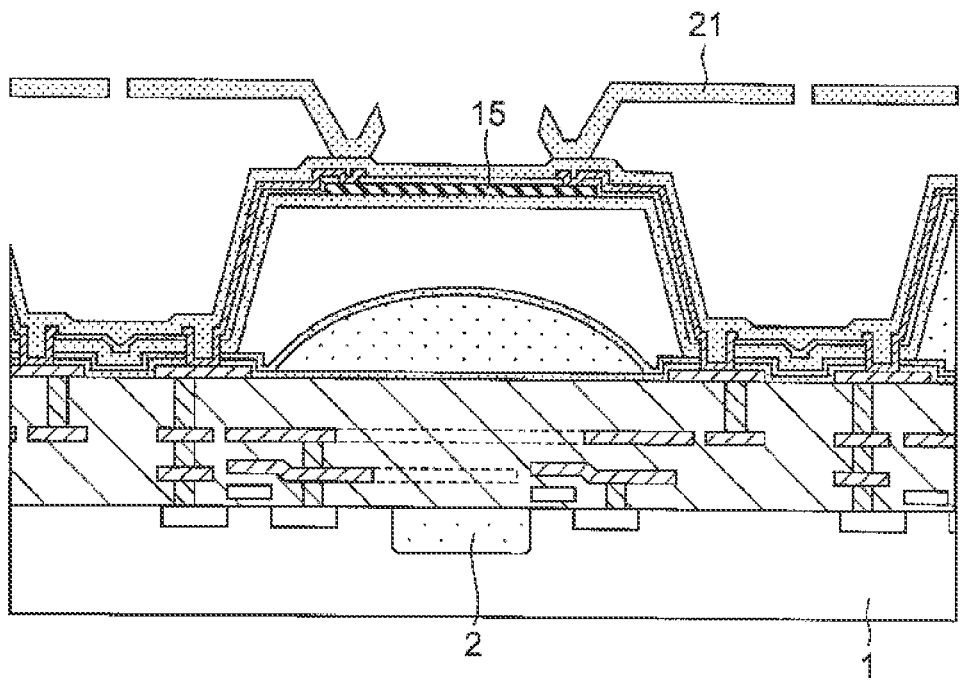
FIG. 7B is a cross-sectional view showing a production step of the method of manufacturing a solid-state image sensing device according to the embodiment of the present invention.

Then, as shown in FIG. 7B, the first and second sacrifice layers are removed by ashing with $O_2$ plasma. Thus, a solid-state image sensing device is completed.

With the aforementioned production method, a solid-state image sensing device having quantum visible light detectors 23 and thermal infrared light detectors 22 for concurrently conducting visible imaging and infrared imaging can achieve high data precision at each of detection points without lowering the resolution of an image in the horizontal or vertical direction.

Examples

Now examples of the present invention will be described.

A solid-state image sensing device in which 320×240 effective unit pixels each including a quantum visible light detector 23 and a thermal infrared light detector 22 were arranged in an imaging area was produced by way of trial. A visible light detection layer 2 was formed by an ion implantation method with $P^+$ ions at 200 keV. The film thickness of a resist pattern used for formation of microlenses was set to be 2 μm. Therefore, the thickest portion of polyimide had a thickness of about 2.6 μm. A microlens protective film 13 was formed of a silicon nitride film having a film thickness of 100 nm. In the thermal infrared light detector 22, a bolometer film 15 was formed of a vanadium oxide film having a film thickness of 100 nm. Each of a lower support film 14, a bolometer protective film 16, and an upper support film 18 was formed of a silicon nitride film. The lower support film 14 had a film thickness of 200 nm, the bolometer protective film 16 had a film thickness of 50 nm, and the upper support film 18 had a film thickness of 150 nm. As a result of performance evaluation, it was confirmed that the solid-state image sensing device had an effective resolution corresponding to 320×240 unit pixels with regard to both of a visible image and an infrared image. Point images could be obtained with the same address for both of the visible image and the infrared image. Thus, high data precision was confirmed.

As described above, according to a solid-state image sensing device of the present invention, a solid-state image sensing device having quantum visible light detectors and thermal infrared light detectors for concurrently conducting visible imaging and infrared imaging can achieve high data precision at each of detection points without lowering the resolution of an image in a horizontal direction or a vertical direction.

Thus, there can be provided a solid-state image sensing device capable of enhancing data precision between points at which visible light is detected and points at which infrared light is detected without lowering a resolution of an image in a horizontal direction or a vertical direction. There can also be provided a method of manufacturing such a solid-state image sensing device.

Although embodiments of the present invention have been described specifically, the present invention is not limited to the aforementioned embodiments. It should be apparent to those skilled in the art that various modifications may be made to the aforementioned embodiments based upon the technical concept of the present invention.

For example, a solid-state image sensing device according to an embodiment of the present invention is applicable to night vision equipment (infrared camera) and thermography.

What is claimed is:

1. A solid-state image sensing device comprising:
   a substrate;
   a plurality of detection units periodically arranged as a two-dimensional array for the substrate, each of the detection units including a visible light detector and an infrared light detector arranged on the same optical axis in a vertical direction so that the visible light detector and the infrared light detector overlap with each other; and
   a signal readout circuit provided in the substrate so as to output signals of the visible light detector and the infrared light detector as time-series signals,
   wherein each of the detection units further includes a microlens provided between the visible light detector and the infrared light detector.

2. The solid-state image sensing device as recited in claim 1, wherein the microlens is covered with a microlens protective film.

3. The solid-state image sensing device as recited in claim 1, wherein the microlens is made of polyimide.

4. The solid-state image sensing device as recited in claim 1, wherein the infrared light detector includes:
   support legs, and
   a diaphragm lifted up from the substrate and held in midair by the support legs, the diaphragm being isolated thermally from the substrate.

5. The solid-state image sensing device as recited in claim 4, wherein the diaphragm includes a bolometer film for detecting a temperature change, and
   each of the detection units is configured to detect infrared light by a resistance change of the bolometer film that is caused by heat resulting from an incident infrared ray absorbed into the diaphragm.

6. The solid-state image sensing device as recited in claim 4, wherein each of the visible light detectors includes a visible light detection layer provided in the substrate, and
   each of the detection units is configured so that an incident visible ray is transmitted through the diaphragm, condensed by the microlens, and directed to the visible light detection layer.

7. The solid-state image sensing device as recited in claim 4, wherein the microlens is provided within a cavity formed below the diaphragm and is positioned right above the visible light detection layer.

\* \* \* \* \*